United States Patent [19]

Yamaoka et al.

[11] Patent Number: 4,515,886

[45] Date of Patent: May 7, 1985

[54] PHOTOSENSITIVE COMPOSITIONS

[75] Inventors: Tsuguo Yamaoka, Chiba; Mitsutoshi Fukuda, Yamaguchi, both of Japan

[73] Assignee: Toyo Soda Manufacturing Co., Ltd., Shinnanyo, Japan

[21] Appl. No.: 579,872

[22] Filed: Feb. 13, 1984

[30] Foreign Application Priority Data

Feb. 16, 1983 [JP] Japan ................................ 58-22873
Feb. 17, 1983 [JP] Japan ................................ 58-23764

[51] Int. Cl.³ ........................ G03C 1/71; G03C 1/72
[52] U.S. Cl. ............................... 430/270; 204/159.18; 430/926; 430/919; 430/923; 430/920
[58] Field of Search ............... 430/270, 287, 280, 916, 430/296, 920, 923, 919, 926, 915; 204/159.18

[56] References Cited

U.S. PATENT DOCUMENTS

| | | | |
|---|---|---|---|
| 3,479,185 | 11/1969 | Chambers, Jr. et al. | 430/916 X |
| 3,640,718 | 2/1972 | Smith | 430/926 X |
| 4,258,111 | 4/1981 | Matsumoto et al. | 430/270 X |
| 4,262,081 | 4/1981 | Bowden et al. | 430/296 X |
| 4,286,049 | 8/1981 | Imamura et al. | 430/287 X |
| 4,299,911 | 6/1981 | Ochi et al. | 430/296 X |
| 4,348,472 | 9/1982 | Jagt | 430/270 X |
| 4,474,869 | 10/1984 | Brault et al. | 430/296 |

FOREIGN PATENT DOCUMENTS

| | | | |
|---|---|---|---|
| 49-106585 | 10/1974 | Japan | 430/325 |
| 52-13314 | 2/1977 | Japan | 430/916 |
| 57-109943 | 7/1982 | Japan | 430/286 |

OTHER PUBLICATIONS

Julius Grant (ed), *Hackh's Chemical Dictionary*, (4th Ed.), "Aryl", McGraw-Hill Book Company, New York, N.Y. 1969, p. 62.

Ken Sukegawa and Shungo Sugawara, *Japanese Journal of Applied Physics*, vol. 20, No. 8, Aug. 1981, pp. L583–L586.

Y. Ohnishi, *Journal of Vaccuum Science and Technology*, vol. 19, No. 4, Nov./Dec. 1981, pp. 1136–1140.

*Primary Examiner*—John E. Kittle
*Assistant Examiner*—Cynthia Hamilton
*Attorney, Agent, or Firm*—Oblon, Fisher, Spivak, McClelland & Maier

[57] ABSTRACT

Photosensitive compositions useful as resists for transistors, ICs, etc. comprising a solution of a photosensitive high polymer of a polymer or a copolymer which contains a unit expressed by the following general formula:

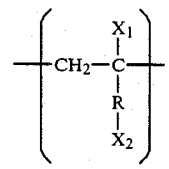

(where $X_1$ is an atom of hydrogen or halogen, a halogenated alkyl group of 1 to 4 carbon atoms or an alkyl group having 1 to 4 carbon atoms, $X_2$ is a halogen atom or a halogenated alkyl group having 1 to 4 carbon atoms and R is an aromatic ring or a heterocyclic ring), and a photosensitizing agent dissolved in organic solvents. The photosensitive compositions show marked improvement in photosensitivity and gamma value.

17 Claims, No Drawings

PHOTOSENSITIVE COMPOSITIONS

BACKGROUND OF THE INVENTION

Field of the Invention

The present invention relates to photosensitive compositions, more particularly to photosensitive compositions for producing semiconductors prepared by adding a photosensitizing organic compound to a solution of a photosensitive high polymer.

The photosensitive composition to be used in the manufacturing processes of circuits for transistors, ICs, LSIs and super LSIs are generally called "resist", for which many kinds of compositions are known.

These compositions exhibit their desired functions through the successive processes including application on a substrate, exposure, development and etching. Therefore photosensitive compositions have to be possessed on the following properties:
(1) high resolution,
(2) high sensitivity,
(3) easy application to form a uniform coating film,
(4) high corrosion resistance, and
(5) high stability during storage.

In addition, stability against such reactive gases as $CF_4$ and $CCl_4$ and reactive gas mixtures containing those gases or in other words "high resistance against dry etching" has been more and more required in recent years, particularly for the miroprocessing. As the base polymer for producing photosensitive compositions which can meet these severe requirements, many experimental results show that polymers containing aromatic or hereto rings in their structure are most prospective and some of them have already been used for practical purposes.

Recently, the improved throughput is required from the economical point of view in the production of semiconductors. Taking resists for instance, further improvement in the sensitivity is required while such properties as resolution, applicability, corrosion resistance, storage stability and dry etching resistance are maintained or improved to higher levels. However, the photosensitive compositions so far conventionally known are not sensitive enough to satisfy the requirement of economical operation for producing semiconductors.

In their intensive investigations to improve the situation, the present inventors have succeeded in achieving remarkable improvements in the sensitivity of photosensitive compositions, while other properties, such as gamma value, are either maintained or improved, by adding an additive which is soluble in an organic solvent to a solution of a photosensitive high polymer in an organic solvent, the high polymer having in the structure an aromatic ring or a heterocyclic ring which is substituted by a group or groups containing a halogen atom or atoms. The present invention has been completed on this discovery.

SUMMARY OF THE INVENTION

More particularly, the present invention provides photosensitive compositions which are prepared by adding a photosensitizing agent to a solution of a photosensitive high molecular substance, the high molecular substance being a polymer or a copolymer containing a unit expressed by the following general formula:

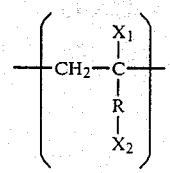

(where $X_1$ is an atom of hydrogen or halogen, a halogenated alkyl group containing 1 to 4 carbon atoms or an alkyl group containing 1 to 4 carbon atoms, $X_2$ is a halogen atom or a halogenated alkyl group containing 1 to 4 carbon atoms and R is an aromatic ring or a heterocyclic ring).

DETAILED DESCRIPTION OF THE INVENTION

According to the present invention, the polymer and the copolymer having the above-mentioned general formula in their structures are not strictly limited with respect to their molecular weight and the concentration in their solution. Any photosensitive high molecular substance, which is soluble in an organic solvent and forms a coating film by an ordinary means, may be used for the purpose. However, the molecular weight of the polymer and the copolymer lies preferably in the range of from 1,000 to 1,000,000. The concentration in their solution should be preferably about 5 to 40% (W/V).

The organic solvents with which to form solutions of high molecular substances include alcohols such as methyl cellosolve and ethyl cellosolve, ketones such as acetone, methylethylketone and methylisobutylketone, esters such as ethyl acetate, n-propyl acetate, n-amyl acetate, isoamyl acetate and ethyl cellosolve acetate, halogenated alkanes such as carbon tetrachloride and tetrachloroethane, heterocyclic compounds such as tetrahydrofuran and pyrrole, aromatic comounds such as benzene, toluene, xylene and monochlorobenzene, and alicyclic compounds such as cyclohexane.

The photosensitizing additives to be used in this invention may be low or high molecular substances selected from the groups listed below, so far as they are soluble in the organic solvents for dissolving the above-mentioned photosensitive high molecular substances. Particularly preferred additives are named in each group.

(1) Compound of benzoic acid family such as p-methoxybenzoic acid and p-amyloxybenzoic acid,
(2) compounds of anthraquinone family such as anthraquinone and 3-chloroanthraquinone,
(3) aromatic nitro compounds such as 5-nitroacenaphthene,
(4) alicyclic amino compounds such as hexane diamine, N-methylcyclohexylamine and dicyclohexylamine,
(5) aniline homologues such as aniline, acetanilide, o-toluidine, m-toluidine, p-toluidine, anthranilic acid, p-phenetidine, o-nitroaniline, m-nitroaniline, p-nitroaniline, o-anisidine, m-anisidine, p-anisidine, and chloroaniline,
(6) N-alkylanilines such as methylaniline, dimethylaniline, ethylaniline, Michler's ketone, dimethylaminoazobenzene, p-dimethylaminobenzoic acid and p-dimethylaminobenzaldehyde,
(7) arylamines such as diphenylamine, p-aminodiphenylamine and triphenylamine, (8) amines having an amino group on their side chain such as benzylamine and β-phenylethylamine,
(9) aromatic diamines such as o-phenylenediamine, m-phenylenediamine, p-phenylenediamine and p-aminoacetanilide,
(10) condensed ring amino compounds such as naphthylamine,
(11) heterocyclic compounds such as pyrrole, imidazole, N-vinylcarbazole and polyvinylpyridine, and
(12) heterocyclic amines such as pyridoxamine.

There is no specific limitation for the amount of addition of these substances, but a preferable range is from 1 to 30% by weight to the photosensitive high molecular substances.

In addition, the nitrogen containing organic compounds listed in (5) through (12) may be employed in the form of a solution in a solvent. The solvents used include alcohols such as methanol, ethanol, n-propanol, isopropanol, n-butanol and glycerine, ethers such as diethylether, fatty acids and derivatives thereof such as acetic acid and acetic anhydride.

For exposure to light of the photosensitive compositions which are applied on a substrate, any light of wavelengths ranging from 200 to 700 nm may be used, but preferably from 200 to 350 nm.

The photosensitive compositions thus produced and thus exposed and developed give the improved sensitivity and better gamma values without losing other properties.

The present invention is illustrated with reference to Examples below, but the invention should not be limited to the Examples.

EXAMPLE 1

Partially chloromethylated polystyrene (CMS-DU, Toyo Soda Manufacturing Co., Ltd.) in an amount of 10 g was dissolved in 100 ml of xylene. The solution with addition of different sensitizing agent was applied by the spin-coat process on a silicon wafer to form a 0.6 μm thick film and was exposed by means of a contact exposing device. The light source was a low pressure mercury lamp and the main wavelength was 2537 Å. The photosensitive layer was developed by soaking in a mixed liquid of isoamyl acetate and ethyl cellosolve, then the thickness of the film was measured and a sensitivity curve was prepared. The irradiation energy per unit area (mJ/cm$^2$) as estimated at the point of 50% remaining film is expressed in terms of the relative sensitivity. Results as shown in the following table.

| Additive | Concentration (g/100 g polymer) | Relative Sensitivity |
|---|---|---|
| — | — | 1.00 |
| p-Methoxybenzoic acid | 10 | 0.71 |
| 5-Nitroacenaphthene | 10 | 0.60 |
| Anthraquinone | 10 | 0.69 |

EXAMPLE 2

Polystyrene (Standard polystyrene F-4, Toyo Soda Manufacturing Co., Ltd.) in an amount of 5 g was dissolved in 100 ml of methylene chloride. The solution with addition of 100 ml of 36% hydrochloric acid was electrolyzed for an organic electrolysis reaction using a platinum electrode. Subsequently the reaction solution was poured into a larger amount of methanol and a precipitate formed was filtered and dried in vacuum. The chlorinated polystyrene obtained was dissolved in xylene together with a different additive, and application, exposure and development were conducted in the same manner as in Example 1, to estimate the relative sensitivity. Results are shown below.

| Additive | Concentration (g/100 g polymer) | Relative Sensitivity |
|---|---|---|
| — | — | 1.00 |
| p-Methoxybenzoic acid | 10 | 0.90 |
| Hexanediamine | 10 | 0.85 |

EXAMPLE 3

Polyvinyl toluene in an amount of 5 g produced by the living polymerization using an organic alkali as catalyst was dissolved in 100 ml of methylene chloride, 100 ml of 36% hydrochloric acid was added to it, and the chlorination reaction was carried out in the same method as in Example 2. The reaction solution was poured into a larger amount of methanol. Precipitate formed was separated, dried in vacuum and dissolved in xylene together with a sensitizing agent. Relative sensitivity was estimated in the same manner as in Example 1. Results are shown below.

| Additive | Concentration (g/100 g polymer) | Relative Sensitivity |
|---|---|---|
| — | — | 1.00 |
| p-Methoxybenzoic acid | 10 | 0.80 |
| 1,6-Hexane diamine | 10 | 0.78 |

EXAMPLE 4

Partially chloromethylated polystyrene in an amount of 30 g used in Example 1 and 36 g of potassium bromide were dissolved in 150 ml of N,N-dimethylformamide. The solution was stirred for 4 hours at 80° C. and then poured into a larger amount of a mixture of water and methanol. Precipitate formed was dissolved in methylethylketone, and reprecipitated with methanol. The precipitate of bromomethylated polystyrene obtained was separated by filtration, dried in vacuum, dissolved in xylene, and application, exposure and development were conducted in the same manner as in Example 1, to estimate relative sensitivity. Results are shown below.

| Additive | Concentration (g/100 g polymer) | Relative Sensitivity |
|---|---|---|
| — | — | 1.00 |
| p-Methoxybenzoic acid | 10 | 0.90 |
| Anthraquinone | 10 | 0.87 |

EXAMPLE 5

Poly(2-vinylnaphthalene) (from Polyscience Co., Ltd.) in an amount of 3 g was dissolved in 50 ml of chloromethyl methyl ether, then 1 ml of tin(II) chloride was added to it, to perform chloromethylation. After being stirred overnight, the reaction solution was poured into methanol and the precipitate formed was separated by filtration and dried. This was dissolved in xylene together with an additive. Then application, exposure and development (benzylacetate) were conducted in the same manner as in Example 1, to obtain following results.

| Additive | Concentration (g/100 g polymer) | Relative Sensitivity |
| --- | --- | --- |
| — | — | 1.00 |
| Anthraquinone | 10 | 0.80 |
| Hexane diamine | 10 | 0.80 |

EXAMPLE 6

Polyvinylcarbazole in an amount of 16 g was placed in 250 ml of chlorobenzene and 100 ml of pyridine was added to it for dissolution. To the solution 10 g of bromine was added and the mixture was stirred for 30 min., and poured into ethanol. Precipitate formed was separated and dissolved in chlorobenzene. Application, exposure and development followed in the same manner as in Example 1, to estimate the relative sensitivity.

| Additive | Concentration (g/100 g polymer) | Relative Sensitivity |
| --- | --- | --- |
| — | — | 1.00 |
| Hexane diamine | 10 | 0.80 |
| p-Methoxybenzoic acid | 10 | 0.75 |

EXAMPLE 7

Ten grams of partially chloromethylated polystyrene (CMS-DU, Toyo Soda Manufacturing Co., Ltd.) having the rate of chloromethylation of 15% and molecular weight 110,000 was dissolved in xylene to make a 100 ml of a solution. To this solution, 1 g of p-dimethylaminobenzaldehyde was added and the composition thus prepared was applied on a silicon wafer by the spin-coating method with 2000 rpm. Exposure was carried out with a contact exposure device. The light source was a low pressure mercury lamp and the main wavelength was at 2537 Å. The formed photosensitive layer was developed by soaking in a mixture of isoamyl acetate and ethyl cellosolve (mixing ratio of 45:55). Then the thickness of the layer was measured, to make a sensitivity curve. The irradiation energy per unit area (mJ/cm$^2$) was estimated at a point where the rate of remaining film was 50%. The values were recalculated to give the relative sensitivity, and the gamma value was reduced from the slope. Results are shown in the following table which reveals that both the sensitivity and the gamma values are improved by using additives.

| Additive | Relative Sensitivity | Gamma Value |
| --- | --- | --- |
| — | 1.0 | 1.55 |
| p-Dimethylamino-benzaldehyde | 0.2 | 2.06 |

EXAMPLE 8

The partially chloromethylated polystyrene used in Example 7 was dissolved in xylene or ethyl cellosolveacetate. Various additives were added to this solution. The solution was then applied, exposed and developed in the same manner as in Example 7, to estimate the relative sensitivity. Results are shown in the table below, revealing that all of the additives were effective to improve the sensitivity.

| Additive | Amount added (g/100 g base polymer) | Relative Sensitivity |
| --- | --- | --- |
| — | — | 1.00 |
| p-Dimethylaminobenzoic acid | 10 | 0.30 |
| p-Aminodiphenylamine | 10 | 0.49 |
| p-Phenylenediamine | 10 | 0.63 |
| Diphenylamine | 10 | 0.62 |
| N—vinylcarbazole | 10 | 0.90 |
| Imidazole | 10 | 0.62 |

EXAMPLE 9

Polystyrene (Standard polystyrene F-4, Toyo Soda Manufacturing Co., Ltd.) in an amount of 5 g was dissolved in 100 ml of methylene chloride and 100 ml of 36% hydrochloric acid was added to it. An organic electrolysis reaction was carried out using a platinum electrode. Then the reaction solution was poured into methanol. The precipitate formed was separated by filtration and dried in vacuum. Chlorinated polystyrene thus prepared was dissolved in xylene together with different additives, applied on a silicon wafer, exposed by means of the exposing device as appeared in Example 1, developed with a mixture of isoamyl acetate and ethyl cellosolve (in a ratio of 2:8) and rinsed with isopropanol, to estimate the relative sensitivity. Results show that the additives were effective to improve the sensitivity.

| Additive | Concentration (g/100 g polymer) | Relative Sensitivity |
| --- | --- | --- |
| — | — | 1.00 |
| Diphenylamine | 10 | 0.67 |
| Phenylenediamine | 10 | 0.80 |

EXAMPLE 10

Polyvinyltoluene in an amount of 5 g produced by the living polymerization using an organic alkali as catalyst was dissolved in 100 ml of methylene chloride. To the mixture was added 100 ml of 36% hydrochloric acid and the chlorination reaction was carried out in the same manner as in Example 9. The reaction solution was poured into a larger amount of methanol. Precipitate formed was separated and dried in vacuum and then dissolved in xylene to make a 10% solution. This solution to which different additives were added was applied to form a 0.6 μm thick film, exposed to light and developed and rinsed to obtain the relative sensitivity.

| Additive | Concentration (g/100 g polymer) | Relative Sensitivity |
| --- | --- | --- |
| — | — | 1.00 |
| Diphenylamine | 10 | 0.67 |
| p-Dimethylamino-benzaldehyde | 10 | 0.67 |

EXAMPLE 11

Polystyrene (Standard polystyrene F-10, Toyo Soda Manufacturing Co., Ltd.) in an amount of 5 g was dissolved in 100 ml of nitrobenzene to which solution 3 g of iodine, 2 g of periodic acid, and 5 mg of 50% sulfuric acid were added and the resulting mixture was stirred for a whole day. The reaction solution was poured into methanol. The supernatant liquor was removed. Precipitate obtained was redissolved in tetrahydrofuran and methanol was added again. Precipitate thus formed was separated and dried in vacuum, and dissolved, together with different kinds of additives, in chlorobenzene. The solution was applied on a silicon wafer to the film thickness of 0.6 μm, exposed to a light with the wavelength 2537 Å, developed with a mixture of isoamyl acetate with dioxide (mixed in a volume ratio 1:1) and rinsed with isopropanol. The relative sensitivity measured with them revealed that these additives were effective to improve the sensitivity.

| Additive | Concentration (g/100 g polymer) | Relative Sensitivity |
|---|---|---|
| — | — | 1.00 |
| p-Dimethylamino-benzoic acid | 10 | 0.65 |
| p-Dimethylamino-benzaldehyde | 10 | 0.65 |

EXAMPLE 12

Three grams of poly(2-vinylnaphthalene) (supplied from Polyscience Co., Ltd.) was dissolved in 50 ml of chloromethylether. To the solution, 1 ml of tin(II) chloride was added and the chloromethylation reaction was carried out. After stirring overnight, the reaction solution was poured into methanol and the precipitate formed was separated and dried in vacuum. The dried matter was dissolved together with different additives in xylene to make a 10% solution. This was applied on a silicon wafer (to 0.5 μm thickness), exposed to light in the same manner as in Example 1, developed with benzyl acetate and rinsed with a mixed solvent of MEK and ethanol. The relative sensitivity obtained with the resist is shown in the table below.

| Additive | Concentration (g/100 g polymer) | Relative Sensitivity |
|---|---|---|
| — | — | 1.00 |
| p-Dimethylamino-benzaldehyde | 10 | 0.85 |
| Diphenylamine | 10 | 0.90 |

EXAMPLE 13

Polyvinylcarbazole in an amount of 16 g was added to 250 ml of chlorobenzene and then 100 ml of pyridine was added to the mixture, to obtain a solution. The solution was stirred with 10 g of bromine added for 30 min., poured into methanol. Precipitate formed was separated, and dissolved in chlorobenzene. This was applied on a silicon wafer, exposed to a light (2537 Å), developed and then rinsed to obtain the relative sensitivity as shown below.

| Additive | Concentration (g/100 g polymer) | Relative Sensitivity |
|---|---|---|
| — | — | 1.00 |
| p-Dimethylbenz-aldehyde | 10 | 0.90 |

EXAMPLE 14

The partially chloromethylated polystyrene in an amount of 30 g which was used in Example 7 was dissolved together with 36 g of potassium bromide in 150 ml of N,N-dimethylformaldehyde. The solution, after being stirred for 4 hours at 80° C., was poured into a large amount of a mixture of water and methanol. Precipitate formed was separated by filtration, dried in vacuum and dissolved in xylene. Application, exposure, development and rinsing in the same manner as in Example 1 gave results in the table below. It is apparent the sensitivity was improved by the addition of additives.

| Additive | Concentration (g/100 g polymer) | Relative Sensitivity |
|---|---|---|
| — | — | 1.00 |
| Naphthylamine | 10 | 0.89 |
| β-Phenylethylamine | 10 | 0.95 |
| p-Toluidine | 10 | 0.85 |

What we claim:

1. A photosensitive composition consisting essentially of a solution of:
   (A) a photosensitive high polymer or copolymer consisting essentially of repeating units of the formula:

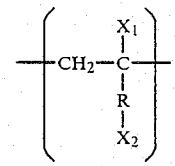

wherein $X_1$ is hydrogen, a halogen atom, $C_1$–$C_4$ haloalkyl group, or a $C_1$–$C_4$ alkyl group; $X_2$ is a halogen atom or a $C_1$–$C_4$ haloalkyl group; and R is an aromatic or heterocyclic ring; and
   (B) a photosensitizing organic compound selected from the group consisting of p-methoxybenzoic acid, p-amyloxybenzoic acid, anthraquinone, 3-chloroanthraquinone, hexane diamine, acetanilide, aromatic nitro compounds, arylamines, alicyclic amino compounds, and heterocyclic compounds.

2. The photosensitive composition according to claim 1, in which the concentration of the photosensitive high polymer in the solution is from 5 to 40 weight/volume percent.

3. The photosensitive composition according to claim 1, in which the ratio of the photosensitizing organic compound to the photosensitive high polymer is from 1 to 30% by weight.

4. The photosensitive composition according to claim 1, in which the photosensitive high polymer has a molecular weight ranging from 1,000 to 1,000,000 and is soluble in an organic solvent.

5. The photosensitive composition according to claim 4, in which the organic solvent is one selected from the group consisting of alcohols, ketones, esters, halogenated alkanes, heterocyclic compounds, aromatic compounds and alicyclic compounds.

6. The photosensitive composition of claim 1, wherein said photosensitizing organic compound is selected from the group consisting of p-methoxybenzoic acid and p-amyloxybenzoic acid.

7. The photosensitive composition of claim 1, wherein said photosensitizing organic compound is selected from the group consisting of anthraquinone and 3-chloroanthraquinone.

8. The photosensitive composition of claim 1, wherein said photosensitizing organic compound is 5-nitroacenaphthene.

9. The photosensitive composition of claim 1, wherein said photosensitizing organic compound is selected from the group consisting of hexane diamine, N-methylcyclohexylamine and dicyclohexylamine.

10. The photosensitive composition of claim 1, wherein said photosensitizing organic compound is selected from the group consisting of aniline, acetanilide, o-toluidine, m-toluidine, p-toluidine, anthranilic acid, p-phenetidine, o-nitroaniline, m-nitroaniline, p-nitroaniline, o-anisidine, m-anisidine, p-anisidine, and chloroaniline.

11. The photosensitive composition of claim 1, wherein said photosensitizing organic compound is an arylamine selected from the group consisting of methylaniline, dimethylaniline, ethylaniline, Michler's ketone, dimethylaminoazobenzene, p-dimethylaminobenzoic acid and p-dimethylaminobenzaldehyde.

12. The photosensitive composition of claim 1, wherein said photosensitizing organic compound is an arylamine selected from the group consisting of diphenylamine, p-aminodiphenylamine and triphenylamine.

13. The photosensitive composition of claim 1, wherein said photosensitizing organic compound is an arylamine selected from the group consisting of as benzylamine and $\beta$-phenylethylamine.

14. The photosensitive composition of claim 1, wherein said photosensitizing organic compound is an arylamine selected from the group consisting of o-phenylenediamine, m-phenylenediamine, p-phenylenediamine, and p-aminoacetanilide.

15. The photosensitive composition of claim 1, wherein said photosensitizing organic compound is naphthylamine.

16. The photosensitive composition of claim 1, wherein said photosensitizing organic compound is a heterocyclic compound selected from the group consisting of pyrrole, imidazole, N-vinylcarbazole and polyvinylpyridine.

17. The photosensitive composition of claim 1, wherein said photosensitizing organic compound is pyridoxamine.

* * * * *